United States Patent [19]

Hamzehdoost et al.

[11] Patent Number: 5,430,331

[45] Date of Patent: Jul. 4, 1995

[54] PLASTIC ENCAPSULATED INTEGRATED CIRCUIT PACKAGE HAVING AN EMBEDDED THERMAL DISSIPATOR

[75] Inventors: Ahmad Hamzehdoost, Sacramento; Sang S. Lee, Sunnyvale, both of Calif.

[73] Assignee: VLSI Technology, Inc., San Jose, Calif.

[21] Appl. No.: 82,123

[22] Filed: Jun. 23, 1993

[51] Int. Cl.⁶ ................ H01L 23/48; H01L 29/40; H01L 23/02

[52] U.S. Cl. ................ 257/796; 257/712; 257/722; 257/787; 257/670; 257/675; 257/666

[58] Field of Search ........... 257/666, 670, 675, 712, 257/713, 717, 719, 720, 722, 796, 787, 788, 789, 790, 791, 792, 798

[56] References Cited

U.S. PATENT DOCUMENTS

| | | | |
|---|---|---|---|
| 4,788,583 | 11/1988 | Kawahara et al. | 257/670 |
| 5,105,259 | 4/1992 | McShane et al. | 257/796 |
| 5,227,662 | 7/1993 | Ohno et al. | 257/675 |

FOREIGN PATENT DOCUMENTS

| | | | |
|---|---|---|---|
| 63-239967 | 10/1988 | Japan | 257/787 |
| 3234046 | 10/1991 | Japan | 257/796 |

*Primary Examiner*—Ngân V. Ngô
*Assistant Examiner*—Carl Whitehead, Jr.
*Attorney, Agent, or Firm*—Patrick T. King

[57] ABSTRACT

An integrated-circuit die attached to a thermally conductive substrate having surface variations formed into the surface of the thermally conductive substrate. A lead frame has inwardly-extending fingers, which are attached to the thermally conductive substrate. The integrated circuit die, lead frame, and substrate are enclosed within a mold cavity. The surface variations of the thermally conductive substrate provide for a more balanced flow of plastic material over the top and bottom of the substrate provide a molded package body substantially free of voids.

45 Claims, 7 Drawing Sheets

PLASTIC ENCAPSULATED INTEGRATED CIRCUIT PACKAGE HAVING AN EMBEDDED THERMAL DISSIPATOR

BACKGROUND OF THE INVENTION

1. Field of the Invention

The present invention relates to integrated-circuit package designs and, more specifically, to improved molded-plastic package designs for thermally enhanced integrated circuits.

2. Prior Art

FIG. 1A shows a conventional quad flat package assembly 10 for an integrated-circuit die 12. The integrated-circuit die 12 is attached to an upset die-attach paddle portion 14, which is at the center region of a conventional lead frame 16. Various inwardly-extending leads terminate at their inner ends in bonding fingers (typically shown as 18 and 20). A layer of adhesive, not shown, is commonly used to attach die 12 and leads 18 and 20 to die-attach paddle 14. The bonding fingers are connected to respective bonding pads on the integrated-circuit die 12 using respective bonding wires (typically shown as 22), as indicated in the Figure. The entire assembly described above is conventionally encapsulated in a molded plastic material, which forms a molded-plastic body 26 for the package assembly 10.

FIG. 1B is a plan view of the lead frame 16 for the conventional quad flat package assembly 10. Note that the ends of the bonding fingers do not extend all the way to the die-attach paddle and are not connected to the die attach paddle portion 14. This provides substantial spaces 30, 32, 34, and 36 between the inner ends of the bonding fingers 18 and 20 and the die attach paddle 14 for the flow of compound during the encapsulation process. The die attach paddle portion 14 is secured in place at the center of the lead frame by tie bars 17. The tie bars 17 extend inwardly from the corners of the lead frame 16 and, unlike bonding fingers 18 and 20, are attached to die paddle portion 14. The assembled die 14 and lead frame 16 combination is encapsulated in molded plastic material by being placed in a cavity formed by the two halves of a mold and by injecting plastic material into the top half of the mold at one corner of the lead frame. Air vents are provided in the mold at the other three corners of the package. Some of the paths for the plastic material to flow into the bottom half of the mold from the top half of the mold are provided by the spaces 30, 32, 34, and 36 which are present between the inner ends of the bonding fingers and the die-attach paddle. Other paths are provided by the spaces between the leads of the lead frame 16. These flow paths permit the flow of the plastic molding material top be substantially balanced between the top half and the bottom half of the of the mold. As the plastic material flows through the mold, air is expelled out of the air vents at the three corners of the mold by the flowing plastic material so that no air remains trapped within the molded-plastic body. If air were to be trapped, it would cause voids, blow holes, or pin holes, in the molded plastic body 26.

FIG. 2 shows a package mold 60, which has a top mold-half 62 and a bottom mold-half 64, for molding a thermally-enhanced, quad flat package. A thermally-enhanced, electrically-insulated substrate 66, which is formed of a material such as, for example, aluminum nitride, has an integrated-circuit die 68 mounted thereto. The thermally conductive, electrically-insulated substrate 66 replaces a conventional die attach paddle (such as the die-attach paddle 14 of FIGS. 1A and 1B) and improves the thermal performance of a molded-plastic package. Bonding fingers (typically shown as 69 and 70) at the inner ends of the leads of a lead frame 72 are attached to the outer margins of the thermally conductive, electrically-insulated substrate 66 with an adhesive film 73 formed of a material such as R-flex 1000. A layer of adhesive, not shown, is also commonly used to attach die 68 to substrate 66. As in the case of a conventional quad flat package assembly, the thermally conductive, electrically-insulated substrate 66 and its attached integrated-circuit die 68 are placed in the cavity formed between the two halves 62 and 64 of the mold 60. Plastic material is injected into the top half of the mold at the inlet gate 74. The plastic material enters the top half 62 of the mold and flows through the spaces between the bonding fingers of the lead frame into the bottom half of the mold. Vents 76 in the mold corners release trapped air.

The arrows shown in FIG. 2 indicate the flow of plastic molding material through the top half of the mold and through the bottom half of the mold. Note that the thermally conductive, electrically-insulated substrate 66 is much greater in thickness and is also much wider than the conventional die-attach paddle 14 shown in FIGS. 1A and 1B. The intrusion of the much thicker bulk of the thermally conductive, electrically-insulated substrate 66 disrupts and unbalances the flow of plastic material in the mold in several ways.

One way that flow is disrupted is that the open spaces between the ends of the bonding fingers and the edge of the integrated-circuit die are blocked by the substrate 66.

Another way that flow is disrupted is that the bulk of the substrate intrudes into the lower half of the mold so that the cross-sectional area for the flow of molding material in the lower space of the cavity is smaller and the flow resistance is greater for the lower space. This results in the flow of the molding material in the upper half of the mold being faster than the flow of molding material in the lower half of the mold. As a result of the differences in flow, the air at different places within the mold halves is expelled at different rates so that, for example, some air is trapped within the bottom part of the mold. The trapped air creates voids, also called blow holes or pin holes, in the body of the package. A typical void 80 is created on the side of the package which is opposite the inlet gate 74, as illustrated in FIG. 2.

FIG. 3 shows a package mold 60, as shown in FIG. 2, having a top mold-half 62 and a bottom mold-half 64, for molding a thermally-enhanced, quad flat package. However, instead of the thermally-enhanced, electrically-insulated substrate 66 of FIG. 2, a slug 82 formed of copper or other similar metal is used as the substrate to which integrated-circuit die 68 is mounted. A layer 84 of insulating material electrically insulates the bottom of the integrated circuit die 68 from the top surface of the slug 82. The slug 82 replaces a conventional die attach paddle (such as the die-attach paddle 14 of FIGS. 1A and 1B) and improves the thermal performance of a molded-plastic package. Bonding fingers (typically shown as 69 and 70) at the inner ends of the leads of a lead frame 72 are attached to the outer margins of the slug 82 with an insulating layer of material disposed between the ends of the bonding fingers 69 and 70 and the slug 82 to insure that the slug 82 is electrically insulated from the bonding fingers 69 and 70 of the lead frame 72.

However, as indicated in FIG. 3, the bottom portion of the slug 82 may extend completely to the bottom of the mold cavity. Thus, after encapsulation of the entire assembly described above, the bottom of slug 82 remains exposed so that heat may be conducted away from integrated-circuit die 68. Since slug 82 extends to the bottom of the mold cavity, the plastic encapsulating material in the bottom of the mold cavity is unable to flow under slug 82 and is only able flow around the edges of slug 82. Again, this results in the flow of the molding material in the upper half of the mold being greater than the flow of molding material in the lower half of the mold, and as a result of the differences in flow, air within the mold halves is expelled by plastic material flowing at different rates creating voids or blow holes in the body of the package.

Consequently, a need exists for a technique to prevent the formation of voids on the body of a thermally-enhanced molded plastic package body caused by differences in the flow rate of the encapsulating material through the mold.

SUMMARY OF THE INVENTION

The present invention provides for a uniform flow of a molding compound around a thermally conductive substrate and attached integrated-circuit die, to provide for void free encapsulation of such integrated circuits.

A package for a thermally-enhanced, molded-plastic quad fiat package is provided. An integrated-circuit die is attached to a thermally conductive substrate, which has a central region to which the integrated-circuit die is attached. A lead frame with inwardly extending bonding fingers is attached to the outer margins of the thermally conductive substrate. Bonding wires are connected between respective bonding pads formed on the integrated-circuit die and the inwardly extending bonding fingers of the lead frame. A plastic molded package body is formed around the integrated-circuit die, the thermally conductive substrate, and the bonding fingers.

The invention provides one or more channels or grooves, which are formed across the bottom surface of the thermally conductive substrate extending from one corner diagonally across the substrate. The thermally conductive substrate and attached integrated-circuit die and lead frame are placed into a mold cavity such that one end of the channel is located proximate to the inlet gate of the mold cavity. As the plastic molding material is injected into the mold cavity, the channels provide a pathway for the plastic molding material to flow across the bottom surface of the thermally conductive substrate thereby balancing the flow of the plastic molding material over the top and bottom of the substrate, to provide a molded package body substantially free of voids. Because the channels or grooves, are arranged diagonally, the molding material is able to flow through the inlet gate of the mold cavity and into the channels or grooves without having to drastically change direction. As such, the present invention eliminates the significant drag or restriction created by causing the flowing mold material to abruptly change direction.

In another embodiment of the invention, a slot for facilitating uniform flow is produced having an opening on the top surface of the thermally conductive substrate and extending completely through the substrate terminating with a bottom opening on the bottom surface of the substrate. The slot is disposed at the corner of the thermally conductive substrate and is arranged such that the greater of the lengthwise and widthwise dimensions of the slot openings extends from the corner of the substrate towards the center of the substrate surfaces. By arranging the slot in this manner, the plastic molding material flows from the corner of the substrate and through the slot with minimized friction. The slot also provides for a more balanced flow of the plastic molding material both over and under the substrate.

In yet another embodiment of the present invention, in addition to forming a slot in the corner of the thermally conductive substrate, the tie bars of the lead frame, which are used to secure the die paddle in place, are removed such that no portion of the lead frame is present in the corner of the substrate. By removing the tie bars from the lead frame, the plastic molding material is able to flow from the mold inlet gate of the mold cavity and into the slot without encountering restriction caused by the lead frame. As a result, the amount of drag on the plastic molding material is even further reduced.

In yet another embodiment of the present invention, in addition to forming a slot in the corner of the substrate, and removing the tie bars of the lead frame, one or more diagonally arranged channels are formed across the bottom surface of the thermally conductive substrate as described above. The channel is formed having one end proximate to the bottom opening of the slot. The thermally conductive substrate and attached integrated-circuit die and lead frame are placed into a mold cavity such that one end of the channel and the slot are located proximate to the inlet gate of the mold cavity. As the plastic mold material is injected into the mold cavity, the plastic mold material is able to flow unobstructed through the slot and into the channel. Thus, the friction on the flow of the plastic molding material is further reduced and a more balanced flow of molding material in both the upper and lower halves of the mold cavity is achieved resulting in a molded package body substantially free of voids.

BRIEF DESCRIPTION OF THE DRAWINGS

The accompanying drawings which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1A:
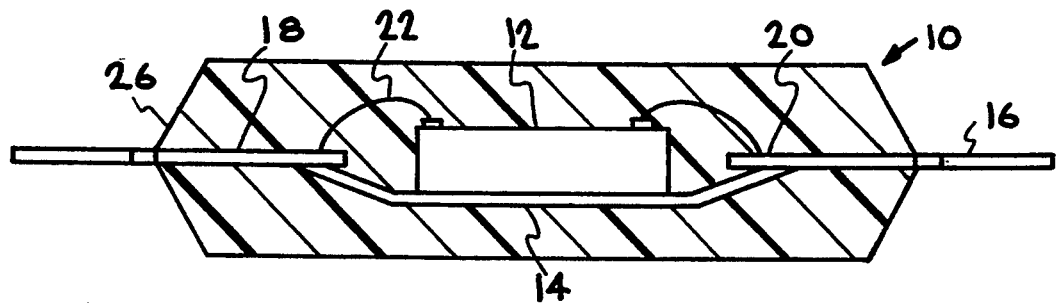
FIG. 1A is a sectional, elevation view of a prior art quad fiat package for an integrated circuit without a thermally conductive, electrically-insulated substrate.
Figure 1B:
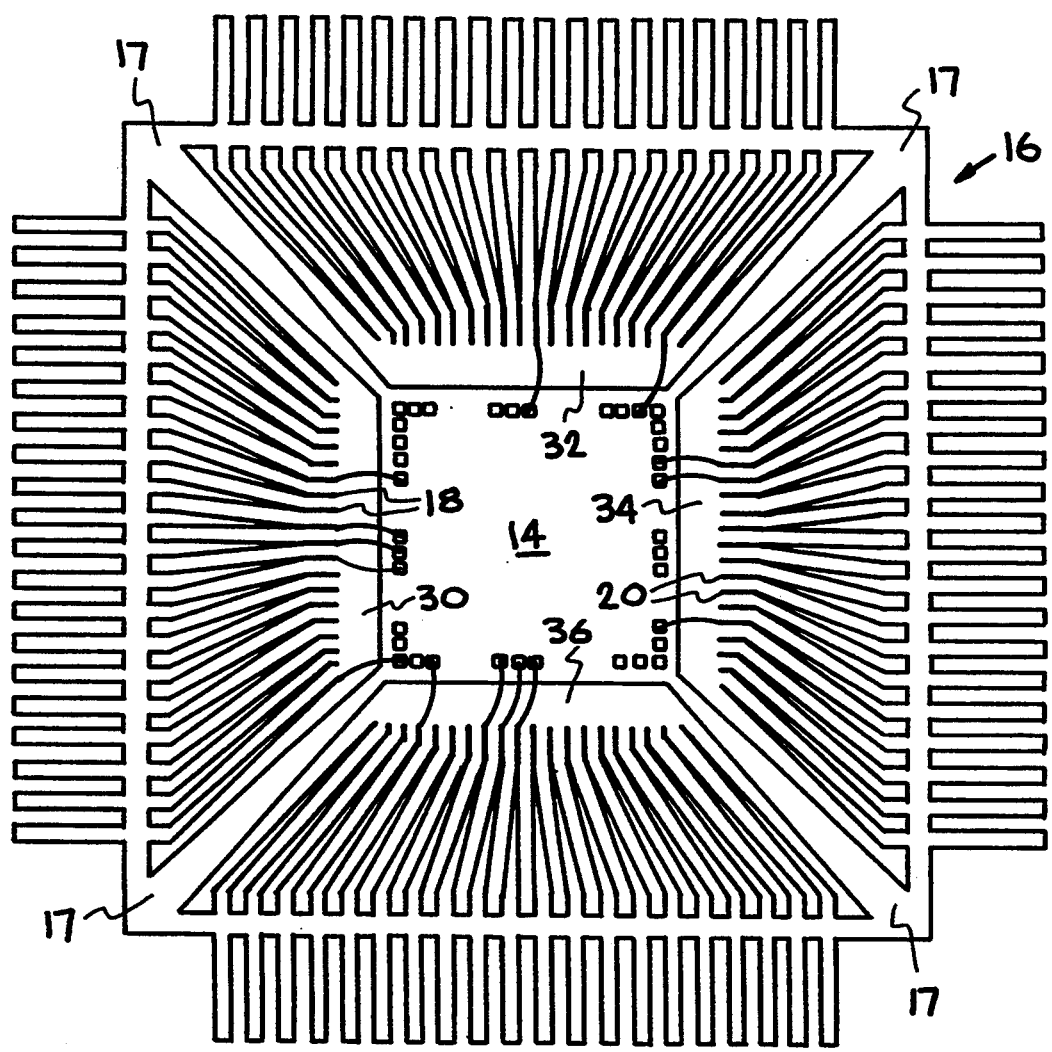
FIG. 1B is a plan view of a prior art lead frame for a conventional quad fiat package.
Figure 2:
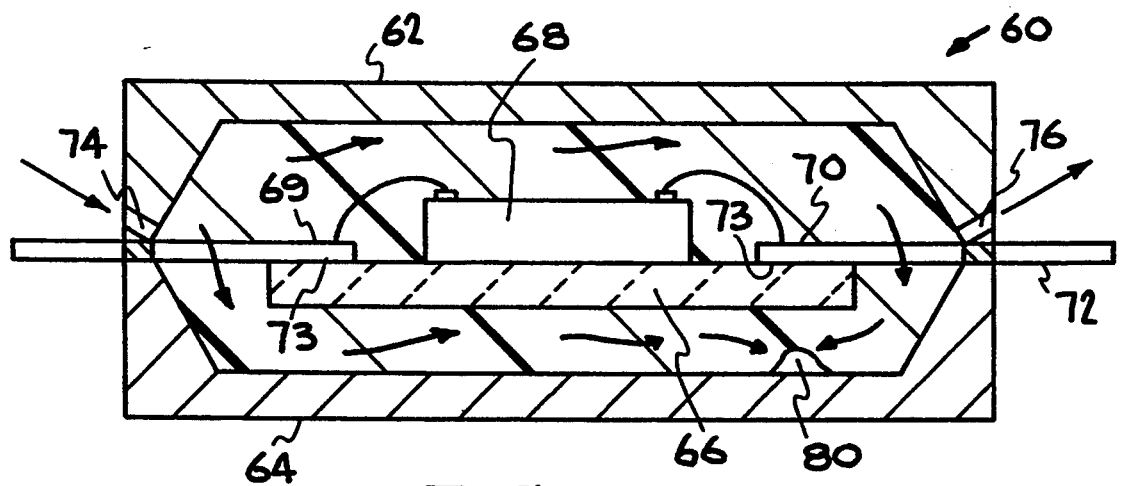
FIG. 2 is a sectional, elevation view of a prior art molded quad fiat package having a thermally conductive, electrically-insulated substrate.
Figure 3:
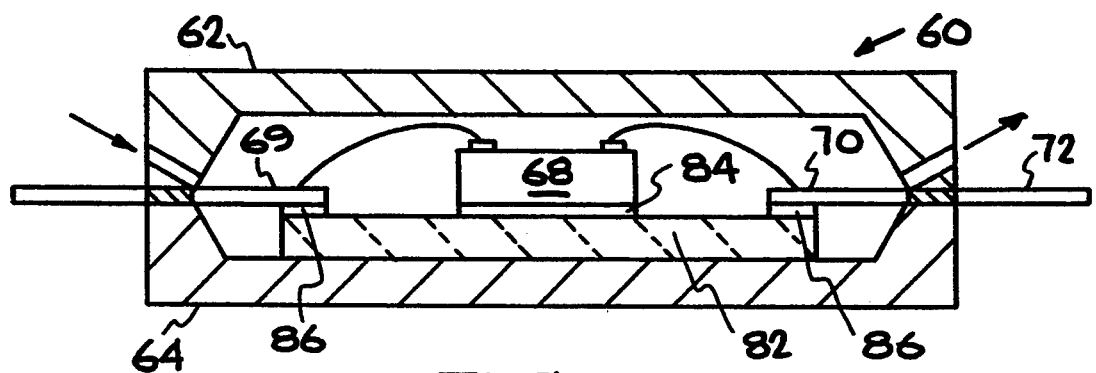
FIG. 3 is a sectional, elevation view of a prior art molded quad fiat package having a die attach paddle with an integrated-circuit die mounted on one side thereof and a thermally conductive slug attached to the other side thereof.
Figure 4:
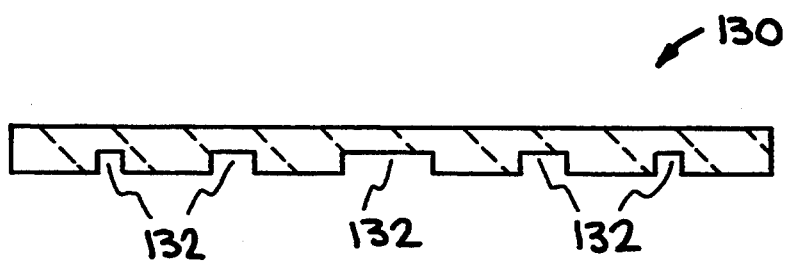
FIG. 4 is a side view of a modified thermally conductive substrate, which has channels formed into the bottom surface thereof in accordance with the present invention.

With reference to FIG. 4, a side view of a modified thermally conductive substrate 130, which has channels 132 formed into the bottom surface thereof, is shown. Channels 132 are formed diagonally across the bottom surface of thermally conductive substrate 130.

Figure 5:
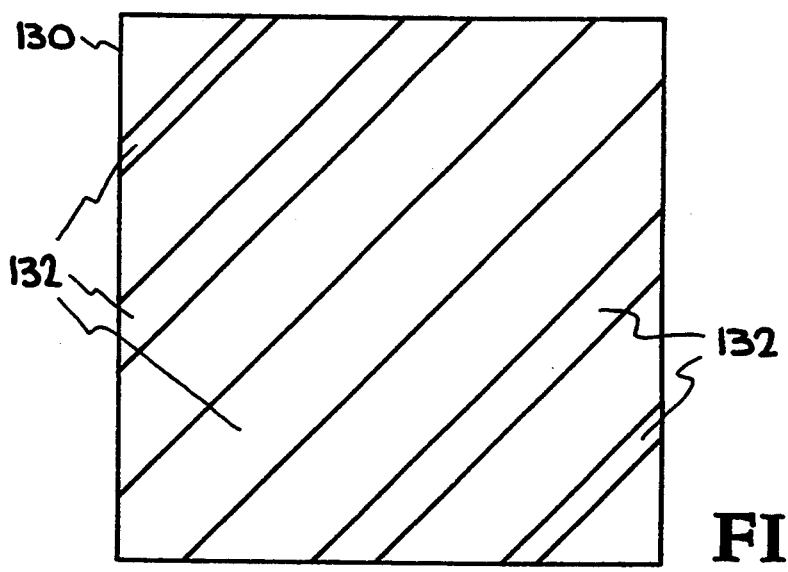
FIG. 5 is a bottom view of the modified thermally conductive substrate of FIG. 4 in accordance with the present invention.

FIG. 5 shows a bottom view of thermally conductive substrate 130 to more clearly show the diagonal arrangement of channels 132 across the bottom of substrate 130. In this typical embodiment of the invention, the channels have a depth of approximately one-half the thickness of the substrate 130. The width of the channels may vary as shown. To compensate for the progressively longer length of the channels nearest the center of substrate 130, the channels nearest the center of substrate 130 have a progressively greater width.

Figure 6:
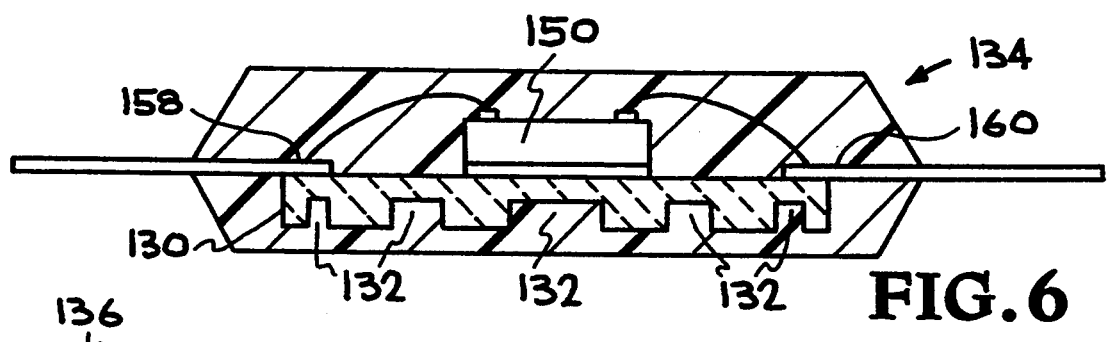
FIG. 6 is a side sectional view of a molded plastic package containing a buried thermally conductive substrate with channels formed into the bottom surface thereof in accordance with the present invention.

Referring now to FIG. 6, a side sectional view of a molded plastic package 134 containing a substrate 130 with channels 132 formed across its bottom surface is shown. In the embodiment of FIG. 6, substrate 130 is formed of an aluminum nitride material, although any of the numerous other similar ceramic-type substrate materials well known in the art are suitable. Additionally, channels 132 may be formed using any of the numerous etching or machining techniques well known in the art. The molding material is, for example, a standard molding compound such as provided by the Sumitomo Company as 6300 HS or HG molding compound, or as 7320C low viscosity molding compound. Additionally, a layer of adhesive, not shown, is commonly used to attach die 150 and leads 158 and 160 to substrate 130.

Several advantages are achieved by forming channels 132 diagonally across the bottom surface of substrate 130. By forming channels 132 into the bottom surface of thermally conductive substrate 130, the flow cross-sectional area in the lower space of the cavity is increased. The additional cross-sectional area allows the molding compound to flow under thermally conductive substrate 130 with less restriction and at a more balanced rate with the flow of the plastic molding material over the top of thermally conductive substrate 130. Channels 132 are formed diagonally across the bottom of substrate 130 such that when substrate 130 and an attached lead frame 154 and integrated circuit die 150 are placed within a mold cavity, channels 132 are oriented such that one end of the channels 132 is located proximate to the inlet gate of the mold cavity. In so doing, a straight flow path for the plastic molding material is provided. The plastic molding material is able to flow into the mold inlet gate and through the channels 132 without significantly altering the flow direction of the plastic molding material. As such, the amount of drag or resistance on the molding material is substantially reduced.

Figure 7:
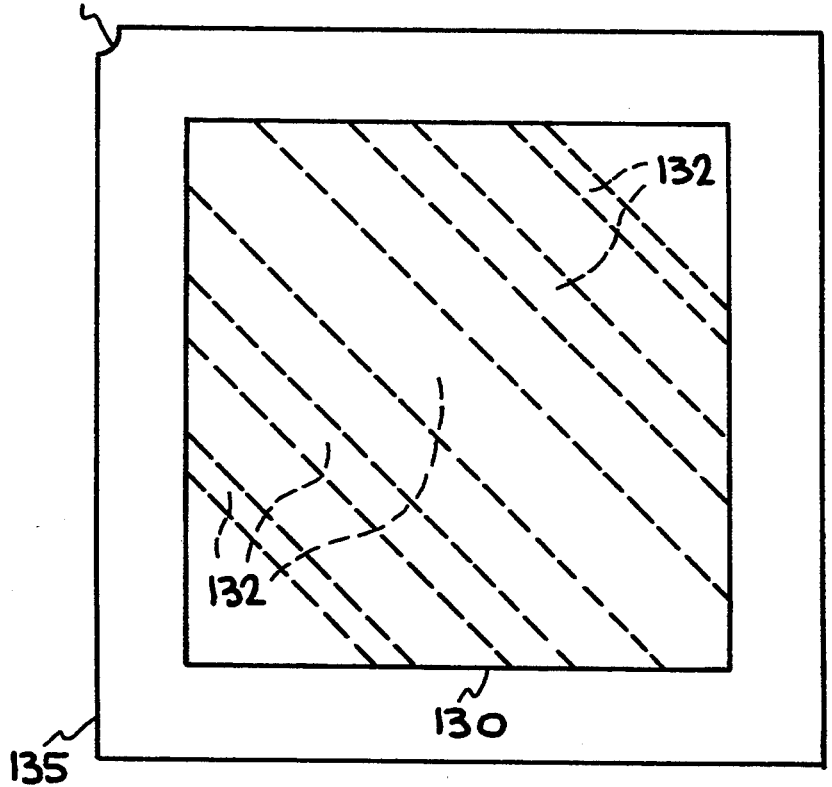
FIG. 7 is a top view illustrating the positioning of the thermally conductive substrate of FIGS. 4 and 5 within a mold cavity in accordance with the present invention.

FIG. 7 is a top view illustrating the positioning of substrate 130 within mold cavity 135. Substrate 130 is positioned such that as plastic molding material is injected into mold cavity 135 at inlet gate 136, the mold material will enter one end of channels 132 and flow diagonally across the bottom surface of substrate 130. Although several channels are shown formed into the bottom of substrate 130, the methods of the present invention are also well suited to the use of a single channel.

Figure 8:
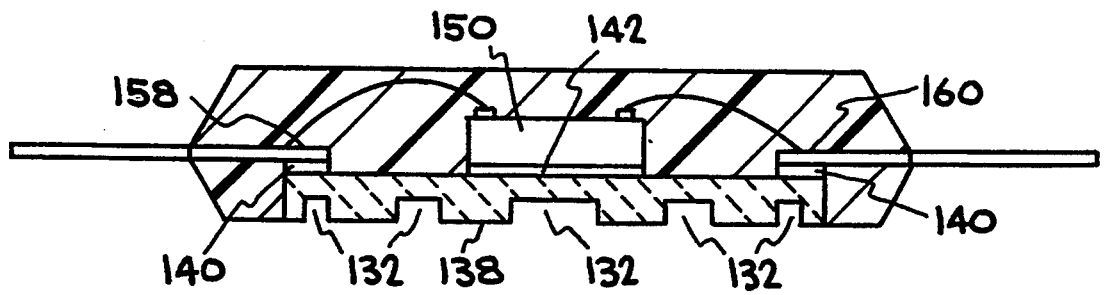
FIG. 8 is a side sectional view of a molded plastic package containing an exposed thermally conductive copper slug with channels formed into the bottom surface thereof in accordance with the present invention.

With reference now to FIG. 8, a cross sectional view of another embodiment of the present invention is shown in which a copper slug 138 is used as the thermally conductive substrate. Although copper is used in the present embodiment, the present invention is also well suited to use any of the numerous thermally conductive metals well known in the art. Additionally, when an electrically conductive material such as copper is used as the substrate 138, and layer of insulating material shown as 140 and 142 must be placed between the ends of inwardly-extending bonding fingers 158 and 160 and integrated circuit die 150, respectively. As shown in FIG. 8 when the thermally conductive substrate 138 extends to the bottom of the mold cavity channels 132 allow the plastic molding material to flow under substrate 138 such that plastic molding material is not limited to flowing solely around the edges of substrate 138. As a result a more balanced flow of plastic molding material over and under the substrate is attained. Furthermore, the additional pathways for the plastic molding material provided by channels 132 do not decrease the surface area of the bottom of the substrate. As such, no compromise in the ability of the substrate to remove heat from the integrated circuit occurs. On the contrary, channels 132 increase the effective surface area of the bottom of substrate 138 allowing for increased removal of heat from integrated circuit 150.

Figure 9A:
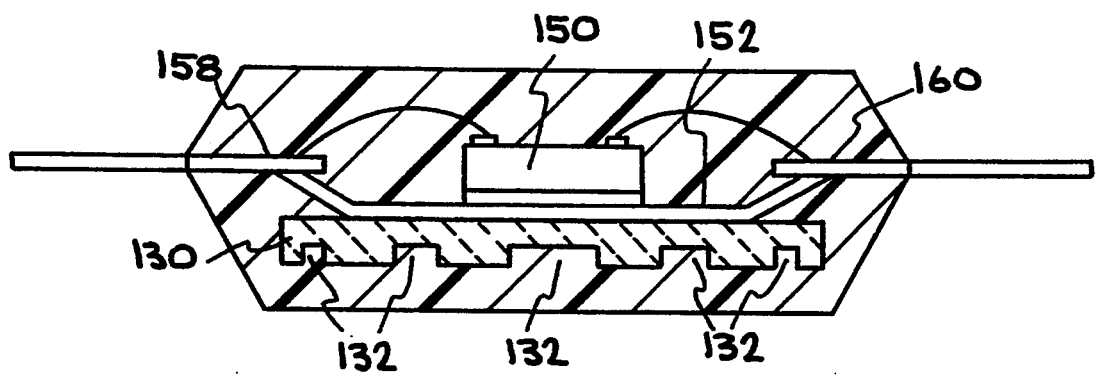
FIG. 9A is a side view of an integrated-circuit die mounted to a central region of a die attach paddle and placed on a buried thermally conductive aluminum nitride substrate having channels formed into the bottom surface thereof in accordance with the present invention.
Figure 9B:
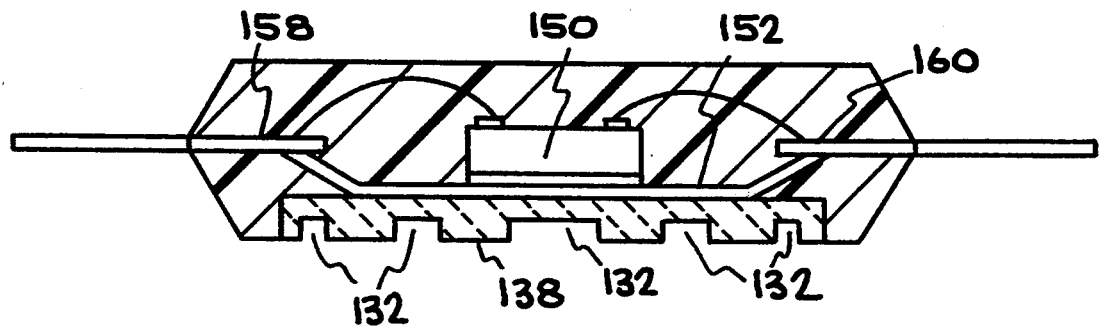
FIG. 9B is a side view of an integrated-circuit die mounted to a central region of a die attach paddle and placed on an exposed thermally conductive copper slug having channels formed into the bottom surface thereof in accordance with the present invention.

With reference now to FIGS. 9A and 9B, additional embodiments of the present invention are shown in which a die attach paddle 152 having an integrated circuit 150 mounted thereon is attached directly to the thermally conductive substrate. Die attach paddle 152 is bonded to a thermally conductive substrate using an adhesive film such as R-flex 1000, or epoxy pastes. Additionally, a layer of adhesive, not shown, is used to attach leads 158 and 160 to die attach paddle 152. In FIG. 9A, the die attach paddle 152 is attached to an aluminum nitride substrate 130 as in the embodiment of FIG. 6. In the embodiment set forth in FIG. 9B the die attach paddle is attached to a copper slug 138 as in the embodiment of FIG. 8. Again, by forming channels 132 into the bottom surface of thermally conductive substrate 130, the flow cross-sectional area in the lower space of the cavity is increased. The additional cross-sectional area allows the molding compound to flow under thermally conductive substrates 130 and 138 with less restriction and at a more balanced rate with the flow of the plastic molding material over the top of thermally conductive substrates 130 and 138. Channels 132 are also formed diagonally across the bottom of substrates 130 and 138 such that one end of the channels 132 is located proximate to the inlet gate of the mold cavity.

Figure 10:
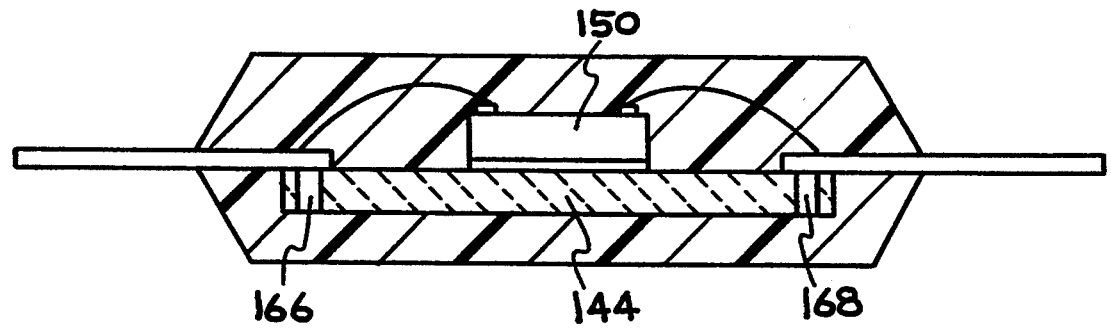
FIG. 10 is a side sectional view of a molded plastic package containing a buried thermally conductive aluminum nitride substrate with slots formed therethrough in accordance with the present invention.

With reference now to FIG. 10 another embodiment of the present invention is shown. As in the previous embodiments, an integrated-circuit die 150 is mounted to a central region of a thermally conductive substrate 144 formed of aluminum nitride. Although aluminum nitride is used in the preferred embodiment, any of the numerous similar materials well known in the art would be suitable. Additionally, a layer of adhesive, not shown, is commonly used to attach die 150 and the leads to substrate 144. As shown in FIG. 10, slots 166 and 168 are formed which extend completely through thermally conductive substrate 144. Slots 166 and 168 are located in the corner region of thermally conductive substrate 144, such that when substrate 144 is placed into the mold cavity, the slots are disposed in close proximity to the mold inlet gate. Slots 166 and 168 allow the plastic molding material to pass through substrate 144. Therefore, as the plastic mold material is introduced into the mold cavity via mold inlet gate, not shown, the plastic mold material is able to flow between the bonding fingers of the lead frame and pass through slots 166 and 168 to allow for a more balanced flow of the molding material both over and under substrate 144. Slots 166 and 168 may also be elongated such that the openings of slots 166 and 168 extend in a lengthwise and a widthwise direction across substrate 144, with the lengthwise dimension of slots 166 and 168 being greater than the widthwise dimension of slots 166 and 168. Furthermore, slots 166 and 168 are aligned such that the lengthwise dimension extends from the corner of substrate 144 towards the center of substrate 144. In so doing, the plastic mold material is able to flow from the inlet gate of the mold cavity and through slots 166 and 168 with minimized resistance. Because the greater dimension of the openings of slot 166 and 168 is aligned towards the center of substrate 144, the flow of the plastic molding material towards the center of substrate 144 is facilitated.

Figure 11:
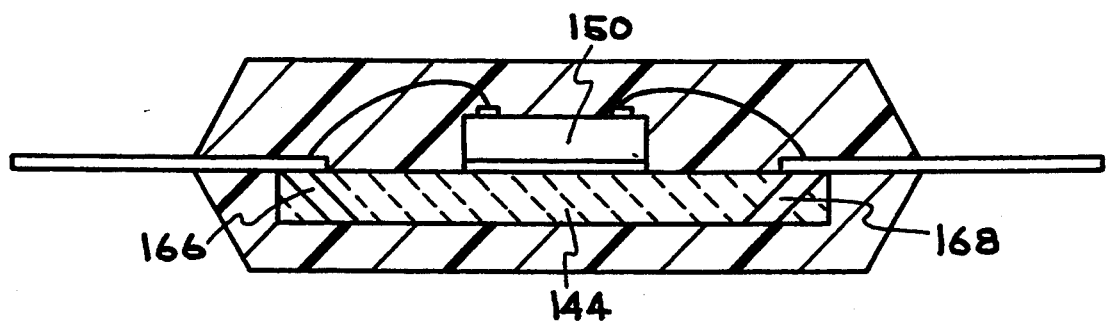
FIG. 11 is a side sectional view of a molded plastic package containing a buried thermally conductive aluminum nitride substrate with angled slots formed therethrough in accordance with the present invention.

As shown in FIG. 11, slots 166 and 168 may also be angled such that the bottom opening of slots 166 and 168 are closer than the top openings to the center of substrate 144.

By angling slots 166 and 168 as set forth in FIG. 11, as the plastic mold material molding passes through slot 166 nearest the mold inlet gate, not shown, the molding material is directed under and towards the center of substrate 144. Air under substrate 144 is pushed up through slot 168 and the towards outlet gate of the mold cavity. In so doing, the formation of voids in the package body due to trapped air is prevented. Additionally, as the plastic molding material reaches the opposite side of substrate 144, the mold material is able to pass up through slot 168. Once again, a more direct flow path is created for the plastic molding material thus reducing the amount of friction or drag on the molding material. In so doing, a more balanced flow of the plastic molding material both over and under substrate 144 is achieved. Since there is a more balanced flow over and under the substrate, the plastic material flowing in the top of the mold cavity and the bottom of the mold cavity meets near the outlet gate of the mold cavity. This eliminates voids, or blowholes, caused by air trapped within the mold.

Figure 12:
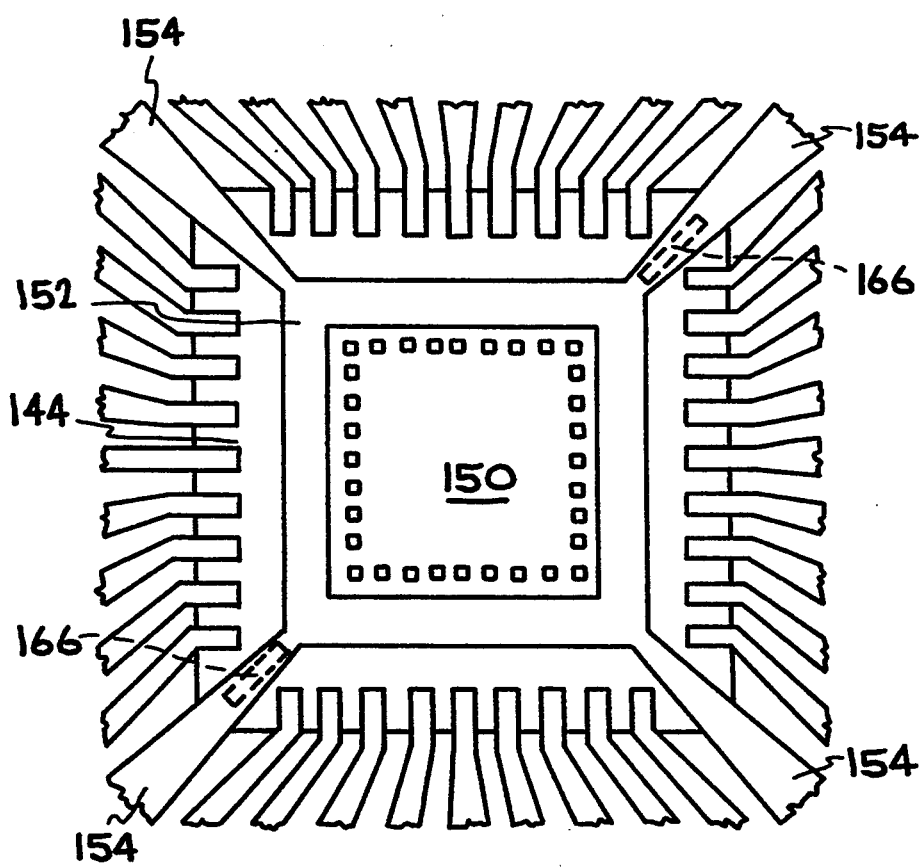
FIG. 12 is a top view of the embodiment of FIG. 10 showing the slots which are formed into the thermally conductive aluminum nitride substrate in accordance with the present invention.

Referring now to FIG. 12, a top view of the embodiment of FIG. 10 is shown in order to more clearly show the positioning of slots 166 and 168. As shown in FIG. 12, slots 166 and 168 are disposed at the corner of substrate 144 and are arranged such that the greater of the lengthwise and widthwise dimensions of the slot openings extends from the corner of substrate 144 towards the center of substrate 144. By arranging slots 166 and 168 in this manner, the plastic molding material flows directly from the corner of substrate 144 and through slots 166 with minimized drag or resistance. Any air remaining under substrate 144 will be expelled through slot 168. As a result, slots 166 and 168 provide a more balanced flow of the plastic molding material both over and under substrate 144. The more balanced flow in the top and bottom halves of the mold cavity eliminates voids, or blowholes, caused by air trapped in the mold. Although two slots are used in the present embodiment of the present invention, a single slot or additional slots located at each corner of substrate 144 are also well suited to the present invention.

Figure 13:
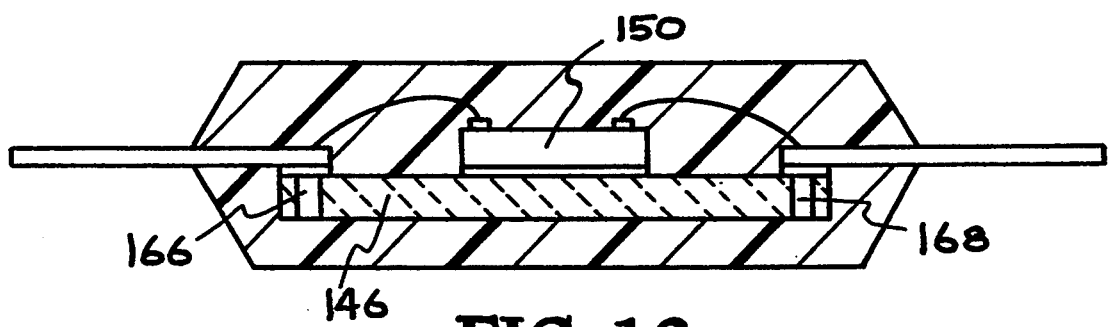
FIG. 13 is a side sectional view of a molded plastic package containing a buried thermally conductive copper slug with slots formed therethrough in accordance with the present invention.

In the embodiment of FIG. 13 slot 166 and 168 are shown formed into a copper slug 146 which is used as the thermally conductive substrate. As in the embodiment of FIG. 10, slots 166 and 168 are formed extending completely through thermally conductive substrate 146. Slots 166 and 168 allow the plastic molding material to pass through substrate 146. Therefore, as the plastic mold material is introduced into the mold cavity via mold inlet gate, not shown, the plastic mold material is able to flow between the bonding fingers of the lead frame and pass through slots 166 and 168 to allow for a more balanced flow of the molding material both over and under substrate 146. Slots 166 and 168 may also be angled such that the bottom opening of slots 166 and 168 are closer than the top openings to the center of substrate 146.

Figure 14A:
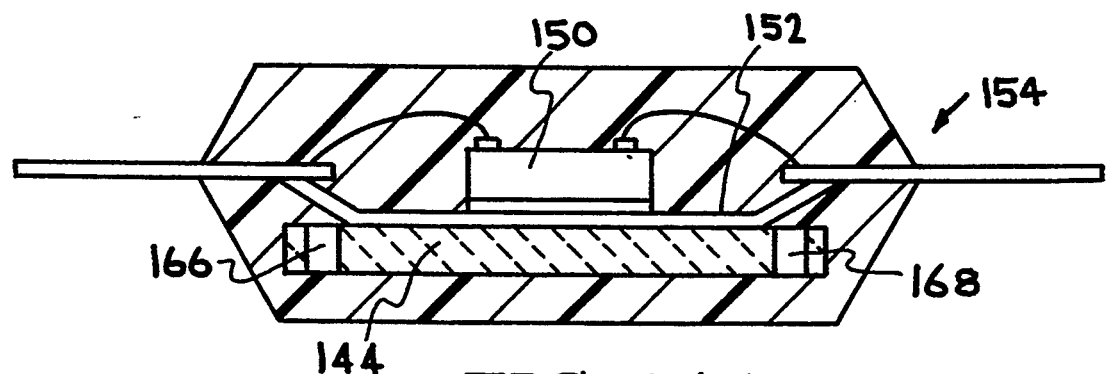
FIG. 14A is a side view of an integrated-circuit die mounted to a central region of a die attach paddle and placed on an a thermally conductive aluminum nitride substrate having slots formed therethrough in accordance with the present invention.
Figure 14B:
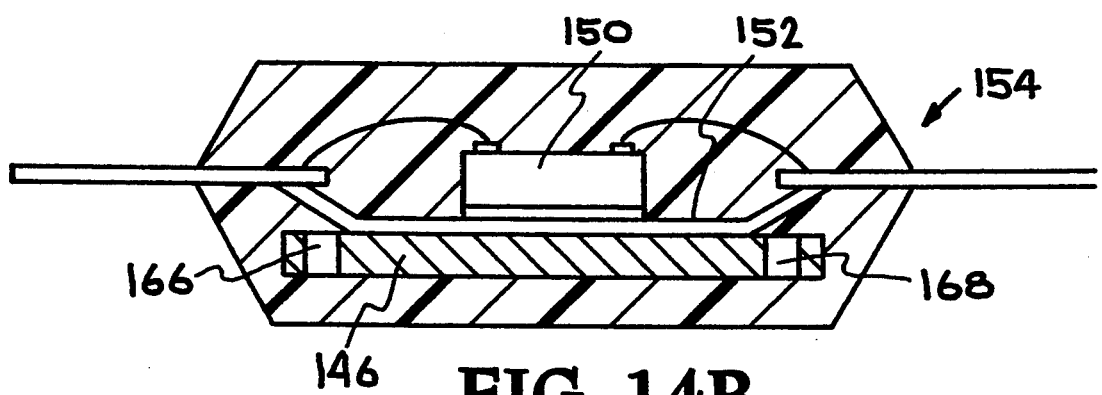
FIG. 14B is a side view of an integrated-circuit die mounted to a central region of a die attach paddle which is fixed to a buried thermally conductive copper slug having slots formed therethrough in accordance with the present invention.

In the embodiment of FIGS. 14A an 14B, die attach paddle 152 is located in the central region of a lead frame 154. Lead frame 154 is centrally attached to a thermally conductive substrate formed of aluminum nitride 144 or other similar material as set forth in FIG. 14A, or a slug 146 formed of copper or other similar material as set forth in FIG. 14B. In either case, however, the die attach paddle 152 may be bonded to the thermally conductive substrate using an adhesive film such as R-flex 1000, not shown. As set forth in previous embodiments, slots 166 and 168 are formed extending completely through the thermally conductive substrate 144 and 146 to allow the plastic molding material to pass through the substrates 144 and 146, such that a more balanced flow of the molding material both over and under substrates 144 and 146 is achieved. As before, slots 166 and 168 may also be angled such that the bottom opening of slots 166 and 168 are closer than the top openings to the center of substrates 144 and 146.

Figure 15:
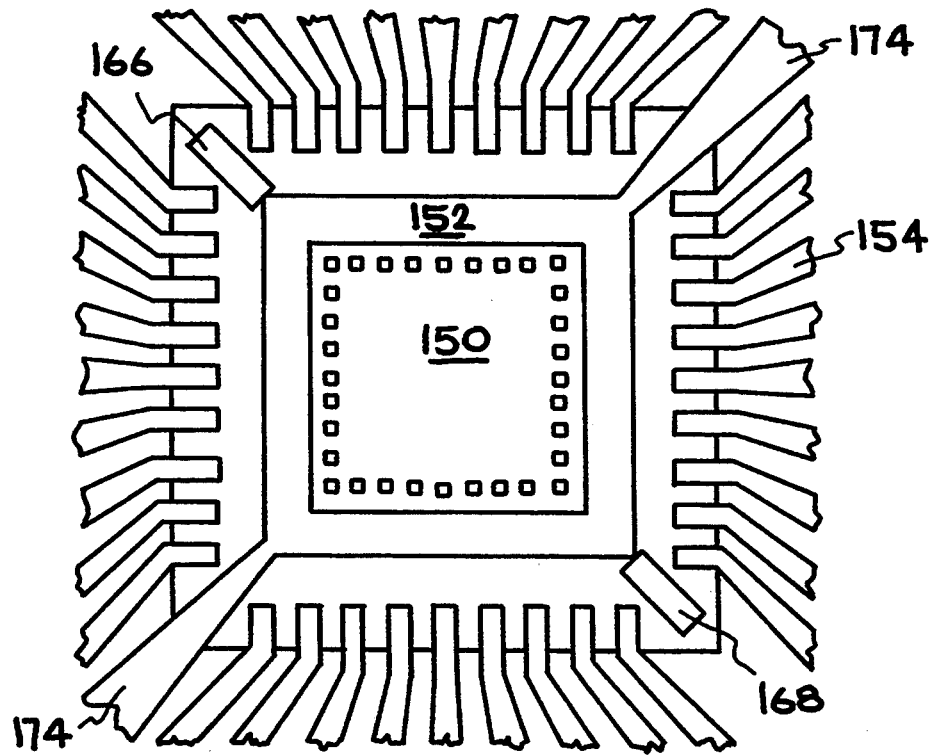
FIG. 15 is a top view of another embodiment of the present invention in which two tie bars of the lead frame are removed such that the slots which are formed into the thermally conductive substrate are not obstructed in accordance with the present invention.

FIG. 15 shows another embodiment of the present invention shown in which slots 166 and 168 are formed into the thermally conductive substrates formed of aluminum nitride or other similar material, or formed into a slug of copper or other similar material. The tie bars which are located directly above slots 166 and 168 are removed from lead frame 154. In so doing, plastic mold material may flow through slots 166 and 168 without any friction caused by the presence of tie bars above slots 166 and 168. As a result the unimpeded flow of the plastic molding material through slots 166 and 168 is possible. Die attach paddle 152 is secured in the center of lead frame 154 by remaining tie bars 174. Slots 166 and 168 may also be angled as describe above.

Figure 16:
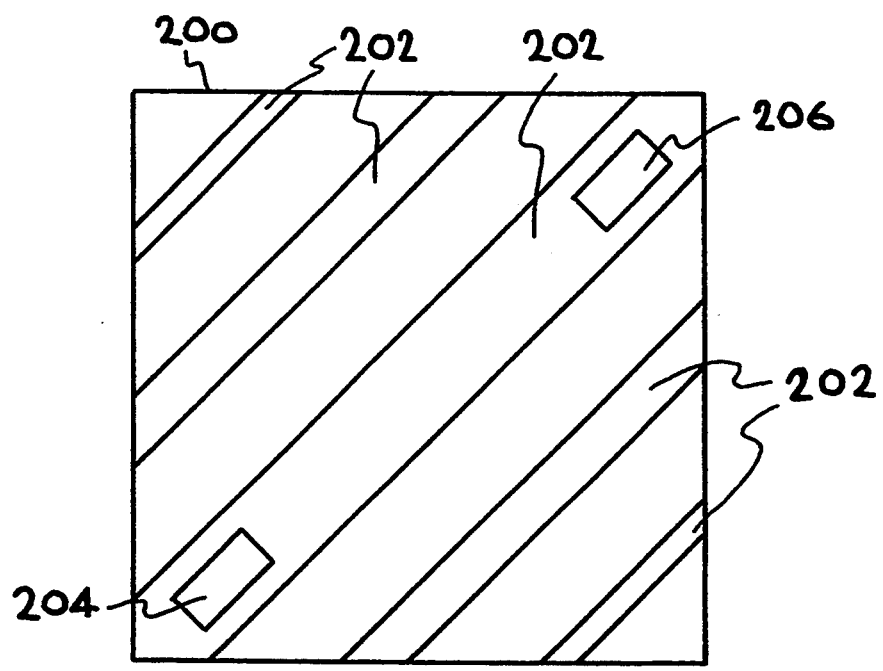
FIG. 16 is a bottom view of a thermally conductive substrate having both slots and channels formed therethrough in accordance with the present invention.

FIG. 16 shows a bottom view of yet another embodiment of the present invention. In addition to forming slots through the thermally conductive substrates and eliminating the tie bars from the corner of the lead frame, channels, as set forth in FIGS. 4–9B, are formed into the bottom of the substrates. As shown in FIG. 16, channels 202 can be formed diagonally across the bottom of substrate 200 such that slots 204 and 206 reside within channels 202. Since slots 204 and 206 are within channels 202, slot 204 and 206 may be utilized even when substrate 200 extends completely to the bottom of the mold cavity. In such instances, the plastic mold material flows unimpeded by any tie bars through slots 204 and 206 into only the middle channel of channels 202. Substrate 200 is arranged within the mold cavity with the inlet gate of the mold cavity located proximate to slot 204 to facilitate the flow of the plastic mold material into slot 204 and through channel 202. Forming channels into the bottom surface of substrate 200 along with the formation of slots 204 and 206 and the removal of the tie bars from the region over slots 204 and 206 balances the flow of plastic material both over and under substrate 200, and provides a molded package body substantially free of voids.

Thus, the present invention provides for a uniform flow of a molding compound around a thermally conductive substrate and attached integrated-circuit die, to provide for void free encapsulation of such integrated circuits. Additionally, although the present invention employs a die-up configuration, the methods of the present invention are also well-suited for use in die-down configurations. Furthermore, the present invention is also well-suited for use with additional substrates such as printed circuit boards.

The foregoing descriptions of specific embodiments of the present invention have been presented for the purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A package for a thermally-enhanced, molded-plastic quad fiat package comprising:
   an integrated-circuit die;
   a thermally conductive substrate having a top and bottom surface, said integrated circuit die coupled to a central region on said top surface of said substrate;
   a lead frame having inwardly-extending bonding fingers, said inwardly-extending bonding fingers of said lead frame coupled to said top surface of said thermally conductive substrate, said inwardly-extending bonding fingers disposed peripherally surrounding said central region;
   a molded package body formed of a plastic material, which is molded around said integrated-circuit die, said thermally conductive substrate and said inwardly extending bonding fingers; and
   said thermally conductive substrate having at least one channel formed into said bottom surface thereof, said at least one channel arranged diagonally across said bottom surface of said substrate, said at least one channel extending in straight unidirectional diagonal path across said bottom surface of said substrate and across a central portion of the bottom surface of said substrate, such that said plastic material has flowed in said at least one channel and across said bottom surface of said substrate to provide a molded package body substantially free of voids.

2. The package of claim 1 wherein said thermally conductive substrate is a ceramic material.

3. The package of claim 2 wherein said thermally conductive substrate is an aluminum nitride material.

4. The package of claim 2 wherein a die attach paddle having top and bottom surfaces has said integrated circuit die centrally coupled to said top surface thereof, and said bottom surface thereof coupled to said central region of said thermally conductive substrate.

5. The package of claim 1 wherein said thermally conductive substrate is a metallic slug, said metallic slug electrically insulated from said integrated circuit die and said inwardly-extending bonding fingers of said lead frame by a layer of insulating material.

6. The package of claim 5 wherein said thermally conductive substrate is copper.

7. The package of claim 5 wherein said bottom surface of said thermally conductive substrate is exposed.

8. The package of claim 5 wherein a die attach paddle having top and bottom surfaces has said integrated circuit die centrally coupled to said top surface thereof, and said bottom surface thereof coupled to said central region of said thermally conductive substrate.

9. A package for a thermally-enhanced, molded-plastic quad fiat package comprising:
- an integrated-circuit die;
- a planar thermally conductive substrate having top and bottom surfaces, said integrated circuit die being coupled to a central region on said top surface of said substrate;
- a lead frame having inwardly-extending bonding fingers, said inwardly-extending bonding fingers of said lead frame coupled to said top surface of said thermally conductive substrate, said inwardly-extending bonding fingers disposed peripherally surrounding said central region;
- a molded package body formed of a plastic material, which is molded around said integrated-circuit die, said thermally conductive substrate, and said inwardly extending bonding fingers; and
- said thermally conductive substrate having at least one slot formed therethrough, said at least one slot having a top opening on said top surface of said substrate and a bottom opening on said bottom surface of said substrate, said slot openings extending in a lengthwise and widthwise direction on said top and bottom surfaces of said substrate wherein said lengthwise dimension of said slot openings is greater than said widthwise dimension of said slot openings, said at least one slot disposed at a corner of said substrate and aligned such that said lengthwise dimension of said openings extends from said corner of said substrate towards the center of said substrate surfaces such that said plastic material is able to flow through said at least one slot at said corner of said substrate and under said substrate to provide a molded package body substantially free of voids.

10. The package of claim 9 wherein said thermally conductive substrate is a ceramic material.

11. The package of claim 10 wherein said thermally conductive substrate is an aluminum nitride material.

12. The package of claim 10 wherein a die attach paddle having top and bottom surfaces has said integrated circuit die centrally coupled to said top surface thereof, and said bottom surface thereof coupled to said central region of said thermally conductive substrate.

13. The package of claim 10 wherein slots are formed at each corner of said substrate.

14. The package of claim 10 wherein said bottom opening of said at least one slot is farther than said top opening of said at least one slot from said corner of said substrate such that said at least one slot extends at an angle through said substrate.

15. The package of claim 10 wherein said bottom opening of said at least one slot is disposed directly between said corner of said substrate and the center of said bottom surface of said substrate such that said plastic material has flowed through said angled slot flows directly toward said center of said bottom surface of said substrate.

16. The package of claim 9 wherein said thermally conductive substrate is a metallic slug, said metallic slug electrically insulated from said integrated circuit die and said inwardly-extending bonding fingers of said lead frame by a layer of insulating material.

17. The package of claim 16 wherein said thermally conductive substrate is copper.

18. The package of claim 9 wherein a die attach paddle having top and bottom surfaces has said integrated circuit die centrally coupled to said top surface thereof, and said bottom surface thereof coupled to said central region of said thermally conductive substrate.

19. The package of claim 16 wherein slots are formed at each corner of said substrate.

20. The package of claim 16 wherein said bottom opening of said at least one slot is farther than said top opening of said at least one slot from said corner of said substrate such that said at least one slot extends at an angle through said substrate.

21. The package of claim 16 wherein said bottom opening of said at least one slot is disposed directly between said corner of said substrate and the center of said bottom surface of said substrate such that said plastic material flowing through said angled at least one slot flows directly toward said center of said bottom surface of said substrate.

22. A package for a thermally-enhanced, molded-plastic quad fiat package comprising:
- an integrated circuit die, said integrated circuit die centrally coupled to the top surface of a planar die attach paddle;
- a planar thermally conductive substrate having top and bottom surfaces, said planar die attach paddle having the bottom surface thereof coupled to a central region on said top surface of said substrate;
- a lead frame having tie bars and inwardly-extending bonding fingers, said inwardly-extending bonding fingers of said lead frame coupled to said top surface of said thermally conductive substrate, said inwardly-extending bonding fingers disposed peripherally surrounding said central region, said tie bars extending inwardly from said lead frame and secured to said die attach paddle, said tie bars disposed at the corners of said lead frame such that said tie bars are disposed extending inwardly over said corners of said planar thermally conductive substrate, said lead frame having no tie bar proximate to one corner of said substrate;
- a molded package body formed of a plastic material, which is molded around said integrated-circuit die, said planar thermally conductive substrate, and said inwardly extending bonding fingers; and
- said planar thermally conductive substrate having a slot formed through said corner which does not have a tie bar located proximate thereto, said slot having a top opening on said top surface of said substrate and a bottom opening on said bottom surface of said substrate, said slot openings extending in a lengthwise and widthwise direction on said top and bottom surfaces of said substrate wherein said lengthwise dimension of said slot openings is greater than said widthwise dimension of said slot openings, said slot aligned such that said lengthwise dimension of said openings extends from said corner which does not have a tie bar located proximate thereto towards the center of said substrate surfaces such that said plastic material is able to flow through said slot at said corner of said substrate and under said substrate to provide a molded package body substantially free of voids.

23. The package of claim 22 wherein said thermally conductive substrate is a ceramic material.

24. The package of claim 23 wherein said thermally conductive substrate is an aluminum nitride material.

25. The package of claim 23 wherein slots are formed at each corner of said substrate.

26. The package of claim 23 wherein said bottom opening of said slot is farther than said top opening of said slot from said corner of said substrate such that said slot extends at an angle through said substrate.

27. The package of claim 23 wherein said bottom opening of said slot is disposed directly between said corner of said substrate and the center of said bottom surface of said substrate such that said plastic material flowing through said angled slot flows directly toward said center of said bottom surface of said substrate.

28. The package of claim 22 wherein said thermally conductive substrate is a metallic slug, said metallic slug electrically insulated from said integrated circuit die and said inwardly-extending bonding fingers of said lead frame by a layer of insulating material.

29. The package of claim 28 wherein said thermally conductive substrate is copper.

30. The package of claim 28 wherein said thermally conductive substrate extends to the bottom of said molded plastic package body.

31. The package of claim 28 wherein slots are formed at each corner of said substrate.

32. The package of claim 28 wherein said bottom opening of said slot is farther than said top opening of said slot from said corner of said substrate such that said slot extends at an angle through said substrate.

33. The package of claim 28 wherein said bottom opening of said slot is disposed directly between said corner of said substrate and the center of said bottom surface of said substrate such that said plastic material flowing through said angled slot flows directly toward said center of said bottom surface of said substrate.

34. A package for a thermally-enhanced, molded-plastic quad flat package comprising:
an integrated circuit die, said integrated circuit die centrally coupled to the top surface of a planar die attach paddle;
a planar thermally conductive substrate having top and bottom surfaces, said planar die attach paddle having the bottom surface thereof coupled to a central region on said top surface of said substrate;
a lead frame having tie bars and inwardly-extending bonding fingers, said inwardly-extending bonding fingers of said lead frame coupled to said top surface of said thermally conductive substrate, said inwardly-extending bonding fingers disposed peripherally surrounding said central region, said tie bars extending inwardly from said lead frame and secured to said die attach paddle, said tie bars disposed at the corners of said lead frame such that said tie bars are disposed extending inwardly over the corners of said planar thermally conductive substrate, said lead frame having one of said tie bars removed such that said corner of said substrate does not have a tie bar located proximate thereto;
a molded package body formed of a plastic material, which is molded around said integrated-circuit die, said planar thermally conductive substrate, and said inwardly extending bonding fingers; and
said planar thermally conductive substrate having a slot formed through said corner which does not have a tie bar located proximate thereto, said slot having a top opening on said top surface of said substrate and a bottom opening on said bottom surface of said substrate, said slot openings extending in a lengthwise and widthwise direction on said top and bottom surfaces of said substrate wherein said lengthwise dimension of said slot openings is greater than said widthwise dimension of said slot openings, said slot aligned such that said lengthwise dimension of said openings extends from said corner which does not have a tie bar located proximate thereto towards the center of said substrate surfaces at least one channel formed across said bottom surface of said thermally conductive substrate, said at least one channel extending diagonally across said bottom surface of said substrate, said at least one channel extending in straight uni-directional diagonal path across said bottom surface of said substrate and across a central portion of the bottom surface of said substrate, with one end of said channel disposed proximate to said bottom opening of said slot such that said plastic material is able to flow into said slot at said corner of said substrate through said channel and under said substrate to provide a molded package body substantially free of voids.

35. The package of claim 34 wherein said thermally conductive substrate is a ceramic material.

36. The package of claim 35 wherein said thermally conductive substrate is an aluminum nitride material.

37. The package of claim 35 wherein slots are formed at each corner of said substrate.

38. The package of claim 35 wherein said bottom opening of said slot is farther than said top opening of said slot from said corner of said substrate such that said slot extends at an angle through said substrate.

39. The package of claim 35 wherein said bottom opening of said slot is disposed directly between said corner of said substrate and the center of said bottom surface of said substrate such that said plastic material flowing through said angled slot flows directly toward said center of said bottom surface of said substrate.

40. The package of claim 34 wherein said thermally conductive substrate is a metallic slug, said metallic slug electrically insulated from said integrated circuit die and said inwardly-extending bonding fingers of said lead frame by a layer of insulating material.

41. The package of claim 40 wherein said thermally conductive substrate is copper.

42. The package of claim 40 wherein said thermally conductive substrate extends to the bottom of said molded plastic package body.

43. The package of claim 40 wherein slots are formed at each corner of said substrate.

44. The package of claim 40 wherein said bottom opening of said slot is farther than said top opening of said slot from said corner of said substrate such that said slot extends at an angle through said substrate.

45. The package of claim 40 wherein said bottom opening of said slot is disposed directly between said corner of said substrate and the center of said bottom surface of said substrate such that said plastic material flowing through said angled slot flows directly toward said center of said bottom surface of said substrate.

* * * * *